(12) United States Patent
Abbott

(10) Patent No.: US 7,566,620 B2
(45) Date of Patent: Jul. 28, 2009

(54) DRAM INCLUDING A VERTICAL SURROUND GATE TRANSISTOR

(75) Inventor: Todd R. Abbott, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/461,246

(22) Filed: Jul. 31, 2006

(65) Prior Publication Data

US 2007/0018223 A1    Jan. 25, 2007

Related U.S. Application Data

(63) Continuation of application No. 11/188,507, filed on Jul. 25, 2005.

(51) Int. Cl.
*H01L 21/336* (2006.01)

(52) U.S. Cl. .................. 438/268; 257/296; 257/298

(58) Field of Classification Search .............. 257/67, 257/296, 298, 302, 326, 908, E27.084, E27.088, 257/E29.13, E29.131; 438/268, 270
See application file for complete search history.

(56) References Cited

U.S. PATENT DOCUMENTS

| | | | |
|---|---|---|---|
| 3,731,287 A | 5/1973 | Seely et al. |
| 3,732,287 A | 5/1973 | Himmele et al. |
| 3,941,629 A | 3/1976 | Jaffe |
| 4,139,442 A | 2/1979 | Bondur et al. |
| 4,234,362 A | 11/1980 | Riseman |
| 4,333,964 A | 6/1982 | Ghezzo |
| 4,419,809 A | 12/1983 | Riseman et al. |
| 4,432,132 A | 2/1984 | Kinsbron et al. |
| 4,470,062 A | 9/1984 | Muramatsu |
| 4,472,459 A | 9/1984 | Fisher |
| 4,502,914 A | 3/1985 | Trumpp et al. |
| 4,508,579 A | 4/1985 | Goth et al. |
| 4,508,757 A | 4/1985 | Fabricius et al. |
| 4,551,910 A | 11/1985 | Patterson |
| 4,570,325 A | 2/1986 | Higuchi |
| 4,615,762 A | 10/1986 | Jastrzebski et al. |
| 4,630,356 A | 12/1986 | Christie et al. |
| 4,648,937 A | 3/1987 | Ogura et al. |

(Continued)

FOREIGN PATENT DOCUMENTS

DE    280 851    7/1990

(Continued)

OTHER PUBLICATIONS

U.S. Appl. No. 10/933,040, filed Sep. 1, 2004, Eppich.

(Continued)

*Primary Examiner*—Zandra Smith
*Assistant Examiner*—Paul E Patton
(74) *Attorney, Agent, or Firm*—Knobbe, Martens, Olson & Bear, LLP

(57) ABSTRACT

DRAM memory cells having a feature size of less than about 4F2 include vertical surround gate transistors that are configured to reduce any short channel effect on the reduced size memory cells. In addition, the memory cells may advantageously include reduced resistance word line contacts and reduced resistance bit line contacts, which may increase a speed of the memory device due to the reduced resistance of the word line and bit line contacts.

22 Claims, 6 Drawing Sheets

U.S. PATENT DOCUMENTS

| | | |
|---|---|---|
| 4,716,131 A | 12/1987 | Okazawa et al. |
| 4,746,630 A | 5/1988 | Hui et al. |
| 4,776,922 A | 10/1988 | Bhattascharyya et al. |
| 4,789,560 A | 12/1988 | Yen |
| 4,838,991 A | 6/1989 | Cote et al. |
| 4,903,344 A | 2/1990 | Inoue |
| 4,959,325 A | 9/1990 | Lee et al. |
| 4,965,221 A | 10/1990 | Dennison et al. |
| 4,983,544 A | 1/1991 | Lu et al. |
| 5,013,680 A | 5/1991 | Lowrey et al. |
| 5,041,898 A | 8/1991 | Urabe et al. |
| 5,047,117 A | 9/1991 | Roberts |
| 5,053,105 A | 10/1991 | Fox, III |
| 5,057,449 A | 10/1991 | Lowrey et al. |
| 5,087,586 A | 2/1992 | Chan et al. |
| 5,117,027 A | 5/1992 | Bernhardt et al. |
| 5,122,848 A | 6/1992 | Lee et al. |
| 5,128,274 A | 7/1992 | Yabu et al. |
| 5,149,669 A | 9/1992 | Hosaka |
| 5,210,046 A | 5/1993 | Crotti |
| 5,260,229 A | 11/1993 | Hodges et al. |
| 5,295,092 A | 3/1994 | Hotta |
| 5,305,252 A | 4/1994 | Saeki |
| 5,316,966 A | 5/1994 | Van Der Plas et al. |
| 5,319,753 A | 6/1994 | MacKenna et al. |
| 5,328,810 A | 7/1994 | Lowrey et al. |
| 5,330,879 A | 7/1994 | Dennison |
| 5,334,548 A | 8/1994 | Shen et al. |
| 5,358,894 A | 10/1994 | Fazan et al. |
| 5,374,572 A | 12/1994 | Roth et al. |
| 5,409,563 A | 4/1995 | Cathey |
| 5,414,287 A | 5/1995 | Hong |
| 5,416,350 A | 5/1995 | Watanabe |
| 5,438,016 A | 8/1995 | Figura et al. |
| 5,457,067 A | 10/1995 | Han |
| 5,458,999 A | 10/1995 | Szabo et al. |
| 5,466,632 A | 11/1995 | Lur et al. |
| 5,468,675 A | 11/1995 | Kaigawa |
| 5,497,017 A | 3/1996 | Gonzalez |
| 5,502,320 A | 3/1996 | Yamada |
| 5,514,885 A | 5/1996 | Myrick |
| 5,539,229 A | 7/1996 | Noble et al. |
| 5,563,012 A | 10/1996 | Neisser |
| 5,569,620 A | 10/1996 | Linn et al. |
| 5,583,065 A | 12/1996 | Miwa |
| 5,596,759 A | 1/1997 | Miller et al. |
| 5,604,159 A | 2/1997 | Cooper et al. |
| 5,607,874 A | 3/1997 | Wang et al. |
| 5,638,318 A | 6/1997 | Seyyedy |
| 5,670,794 A | 9/1997 | Manning |
| 5,675,164 A | 10/1997 | Brunner et al. |
| 5,677,865 A | 10/1997 | Seyyedy |
| 5,679,591 A | 10/1997 | Lin et al. |
| 5,680,344 A | 10/1997 | Seyyedy |
| 5,700,733 A | 12/1997 | Manning |
| 5,705,321 A | 1/1998 | Brueck et al. |
| 5,747,377 A | 5/1998 | Wu |
| 5,748,519 A | 5/1998 | Tehrani et al. |
| 5,753,546 A | 5/1998 | Koh et al. |
| 5,756,395 A | 5/1998 | Rostoker et al. |
| 5,780,349 A | 7/1998 | Naem |
| 5,789,269 A | 8/1998 | Mehta et al. |
| 5,789,306 A | 8/1998 | Roberts et al. |
| 5,789,320 A | 8/1998 | Andricacos et al. |
| 5,795,830 A | 8/1998 | Cronin et al. |
| 5,798,544 A | 8/1998 | Ohya et al. |
| 5,804,458 A | 9/1998 | Tehrani et al. |
| 5,821,600 A | 10/1998 | Chan |
| 5,834,359 A | 11/1998 | Jeng et al. |
| 5,841,611 A | 11/1998 | Sakakima et al. |
| 5,861,328 A | 1/1999 | Tehrani et al. |
| 5,864,496 A * | 1/1999 | Mueller et al. ............. 365/69 |
| 5,892,708 A | 4/1999 | Pohm |
| 5,895,238 A | 4/1999 | Mitani |
| 5,895,273 A | 4/1999 | Burns et al. |
| 5,899,727 A | 5/1999 | Hause et al. |
| 5,902,690 A | 5/1999 | Tracy et al. |
| 5,905,285 A | 5/1999 | Gardner et al. |
| 5,907,170 A | 5/1999 | Forbes et al. |
| 5,909,618 A | 6/1999 | Forbes et al. |
| 5,909,630 A | 6/1999 | Roberts et al. |
| 5,917,745 A | 6/1999 | Fujii |
| 5,917,749 A | 6/1999 | Chen et al. |
| 5,956,267 A | 9/1999 | Hurst et al. |
| 5,963,469 A | 10/1999 | Forbes |
| 5,963,803 A | 10/1999 | Dawson et al. |
| 5,977,579 A | 11/1999 | Noble |
| 5,981,318 A | 11/1999 | Blanchard |
| 5,998,256 A | 12/1999 | Juengling |
| 6,004,862 A | 12/1999 | Kim et al. |
| 6,005,798 A | 12/1999 | Sakakima et al. |
| 6,005,800 A | 12/1999 | Koch et al. |
| 6,010,946 A | 1/2000 | Hisamune et al. |
| 6,042,998 A | 3/2000 | Brueck et al. |
| 6,049,106 A | 4/2000 | Forbes |
| 6,057,573 A | 5/2000 | Kirsch et al. |
| 6,063,688 A | 5/2000 | Doyle et al. |
| 6,066,191 A | 5/2000 | Tanaka et al. |
| 6,066,869 A * | 5/2000 | Noble et al. ............. 257/296 |
| 6,071,789 A | 6/2000 | Yang et al. |
| 6,072,209 A | 6/2000 | Noble et al. |
| 6,077,745 A | 6/2000 | Burns et al. |
| 6,097,065 A | 8/2000 | Forbes et al. |
| 6,104,068 A | 8/2000 | Forbes |
| 6,104,633 A | 8/2000 | Abraham et al. |
| 6,111,782 A | 8/2000 | Sakakima et al. |
| 6,121,148 A | 9/2000 | Bashir et al. |
| 6,134,139 A | 10/2000 | Bhattacharyya et al. |
| 6,141,204 A | 10/2000 | Schuegraf et al. |
| 6,147,405 A | 11/2000 | Hu |
| 6,150,211 A | 11/2000 | Zahurak |
| 6,150,687 A | 11/2000 | Noble et al. |
| 6,150,688 A * | 11/2000 | Maeda et al. ............. 257/302 |
| 6,157,064 A | 12/2000 | Huang |
| 6,165,833 A | 12/2000 | Parekh et al. |
| 6,172,391 B1 | 1/2001 | Goebel et al. |
| 6,174,780 B1 | 1/2001 | Robinson |
| 6,175,146 B1 | 1/2001 | Lane et al. |
| 6,211,044 B1 | 4/2001 | Xiang et al. |
| 6,229,169 B1 | 5/2001 | Hofmann et al. |
| 6,236,590 B1 | 5/2001 | Bhattacharyya et al. |
| 6,238,976 B1 | 5/2001 | Noble et al. |
| 6,246,083 B1 | 6/2001 | Noble |
| 6,265,742 B1 | 7/2001 | Gruening et al. |
| 6,271,080 B1 | 8/2001 | Mandelman et al. |
| 6,274,905 B1 | 8/2001 | Mo |
| 6,282,113 B1 | 8/2001 | Debrosse |
| 6,288,454 B1 | 9/2001 | Allman et al. |
| 6,291,334 B1 | 9/2001 | Somekh |
| 6,297,554 B1 | 10/2001 | Lin |
| 6,306,727 B1 | 10/2001 | Akram |
| 6,316,309 B1 * | 11/2001 | Holmes et al. ............. 438/246 |
| 6,320,222 B1 | 11/2001 | Forbes et al. |
| 6,348,380 B1 | 2/2002 | Weimer et al. |
| 6,350,635 B1 | 2/2002 | Noble et al. |
| 6,355,961 B1 | 3/2002 | Forbes |
| 6,362,057 B1 | 3/2002 | Taylor, Jr. et al. |
| 6,368,950 B1 | 4/2002 | Xiang et al. |
| 6,376,317 B1 | 4/2002 | Forbes et al. |
| 6,377,070 B1 | 4/2002 | Forbes |
| 6,383,907 B1 | 5/2002 | Hasegawa et al. |
| 6,391,782 B1 | 5/2002 | Yu |
| 6,395,613 B1 | 5/2002 | Juengling |
| 6,396,096 B1 | 5/2002 | Park et al. |

| | | | | | | |
|---|---|---|---|---|---|---|
| 6,399,979 B1 | 6/2002 | Noble et al. | | 6,773,998 B1 | 8/2004 | Fisher et al. |
| 6,403,429 B2 | 6/2002 | Noble | | 6,777,725 B2 | 8/2004 | Willer et al. |
| 6,404,056 B1 | 6/2002 | Kuge et al. | | 6,781,212 B1 | 8/2004 | Kao et al. |
| 6,413,825 B1 | 7/2002 | Forbes | | 6,794,699 B2 | 9/2004 | Bissey et al. |
| 6,414,356 B1 | 7/2002 | Forbes et al. | | 6,794,710 B2 | 9/2004 | Change et al. |
| 6,424,001 B1 | 7/2002 | Forbes et al. | | 6,797,573 B2 | 9/2004 | Brown |
| 6,424,561 B1 | 7/2002 | Li et al. | | 6,800,930 B2 | 10/2004 | Jackson et al. |
| 6,440,801 B1 | 8/2002 | Furukawa et al. | | 6,801,056 B2 | 10/2004 | Forbes |
| 6,448,601 B1 | 9/2002 | Forbes et al. | | 6,806,137 B2 | 10/2004 | Tran et al. |
| 6,455,372 B1 | 9/2002 | Weimer | | 6,808,979 B1 | 10/2004 | Lin et al. |
| 6,458,662 B1 | 10/2002 | Yu | | 6,811,954 B1 | 11/2004 | Fukuda |
| 6,459,119 B1 | 10/2002 | Huang et al. | | 6,825,529 B2 | 11/2004 | Chidambarrao et al. |
| 6,461,957 B1 | 10/2002 | Yokoyama et al. | | 6,828,580 B2 | 12/2004 | Zhang |
| 6,475,867 B1 | 11/2002 | Hui et al. | | 6,835,988 B2 | 12/2004 | Yamashita |
| 6,475,869 B1 | 11/2002 | Yu | | 6,844,591 B1 | 1/2005 | Tran |
| 6,492,233 B2 | 12/2002 | Forbes et al. | | 6,844,594 B2 | 1/2005 | Juengling |
| 6,496,034 B2 | 12/2002 | Forbes et al. | | 6,867,116 B1 | 3/2005 | Chung |
| 6,498,062 B2 | 12/2002 | Durcan et al. | | 6,875,703 B1 | 4/2005 | Furukawa et al. |
| 6,500,763 B2 | 12/2002 | Kim et al. | | 6,881,627 B2 | 4/2005 | Forbes et al. |
| 6,504,201 B1 | 1/2003 | Noble et al. | | 6,882,006 B2 * | 4/2005 | Maeda et al. .............. 257/329 |
| 6,504,255 B2 | 1/2003 | Keeth | | 6,888,755 B2 | 5/2005 | Harari |
| 6,514,884 B2 | 2/2003 | Maeda | | 6,890,812 B2 | 5/2005 | Forbes et al. |
| 6,522,584 B1 | 2/2003 | Chen et al. | | 6,890,858 B2 | 5/2005 | Juengling et al. |
| 6,531,727 B2 | 3/2003 | Forbes et al. | | 6,893,972 B2 | 5/2005 | Rottstegge et al. |
| 6,534,243 B1 | 3/2003 | Templeton | | 6,900,521 B2 | 5/2005 | Forbes et al. |
| 6,537,870 B1 | 3/2003 | Shen | | 6,924,191 B2 | 8/2005 | Liu et al. |
| 6,538,916 B2 | 3/2003 | Ohsawa | | 6,926,843 B2 | 8/2005 | Cantell et al. |
| 6,545,904 B2 | 4/2003 | Tran | | 6,936,507 B2 | 8/2005 | Tang et al. |
| 6,548,396 B2 | 4/2003 | Naik et al. | | 6,939,808 B2 | 9/2005 | Tzou et al. |
| 6,551,878 B2 | 4/2003 | Clampitt et al. | | 6,946,709 B2 | 9/2005 | Yang |
| 6,559,017 B1 | 5/2003 | Brown et al. | | 6,955,961 B1 | 10/2005 | Chung |
| 6,559,491 B2 | 5/2003 | Forbes et al. | | 6,960,510 B2 | 11/2005 | Deshpande et al. |
| 6,566,280 B1 | 5/2003 | Meagley et al. | | 6,960,832 B2 | 11/2005 | Shimazu et al. |
| 6,566,682 B2 | 5/2003 | Forbes | | 6,962,867 B2 | 11/2005 | Jackson et al. |
| 6,570,220 B2 | 5/2003 | Doyle et al. | | 6,964,895 B2 | 11/2005 | Hsu |
| 6,573,030 B1 | 6/2003 | Fairbairn et al. | | 6,967,140 B2 | 11/2005 | Doyle |
| 6,602,779 B1 | 8/2003 | Li et al. | | 6,998,319 B2 | 2/2006 | Tanaka |
| 6,617,060 B2 | 9/2003 | Weeks et al. | | 7,005,240 B2 | 2/2006 | Manger et al. |
| 6,617,651 B2 | 9/2003 | Ohsawa | | 7,015,124 B1 | 3/2006 | Fisher et al. |
| 6,627,933 B2 | 9/2003 | Juengling | | 7,019,349 B2 | 3/2006 | Katsumata et al. |
| 6,632,741 B1 | 10/2003 | Clevenger et al. | | 7,045,859 B2 | 5/2006 | Amali et al. |
| 6,635,917 B2 | 10/2003 | Juengling | | 7,049,702 B2 | 5/2006 | Tseng |
| 6,638,441 B2 | 10/2003 | Change et al. | | 7,056,786 B2 | 6/2006 | Yun et al. |
| 6,639,268 B2 | 10/2003 | Forbes et al. | | 7,071,043 B2 | 7/2006 | Tang et al. |
| 6,641,985 B2 | 11/2003 | Unno et al. | | 7,078,296 B2 | 7/2006 | Chau et al. |
| 6,645,806 B2 | 11/2003 | Roberts | | 7,091,566 B2 | 8/2006 | Zhu et al. |
| 6,646,303 B2 | 11/2003 | Satoh et al. | | 7,098,105 B2 | 8/2006 | Juengling |
| 6,664,806 B2 | 12/2003 | Forbes et al. | | 7,098,536 B2 | 8/2006 | Yang et al. |
| 6,667,237 B1 | 12/2003 | Metzler | | 7,105,089 B2 | 9/2006 | Fanselow et al. |
| 6,670,642 B2 | 12/2003 | Takaura et al. | | 7,109,544 B2 | 9/2006 | Schloesser et al. |
| 6,673,684 B1 | 1/2004 | Huang et al. | | 7,112,483 B2 | 9/2006 | Lin et al. |
| 6,677,230 B2 | 1/2004 | Yokoyama et al. | | 7,112,815 B2 | 9/2006 | Prall |
| 6,686,245 B1 | 2/2004 | Mathew et al. | | 7,115,525 B2 | 10/2006 | Abatchev et al. |
| 6,686,274 B1 | 2/2004 | Shimazu et al. | | 7,118,960 B2 | 10/2006 | Tran |
| 6,689,695 B1 | 2/2004 | Lui et al. | | 7,118,988 B2 | 10/2006 | Buerger et al. |
| 6,693,026 B2 | 2/2004 | Kim et al. | | 7,122,425 B2 | 10/2006 | Chance et al. |
| 6,696,746 B1 | 2/2004 | Farrar et al. | | 7,151,040 B2 | 12/2006 | Tran et al. |
| 6,706,571 B1 | 3/2004 | Yu et al. | | 7,151,690 B2 | 12/2006 | Forbes |
| 6,707,092 B2 | 3/2004 | Sasaki | | 7,153,734 B2 | 12/2006 | Brask et al. |
| 6,707,706 B2 | 3/2004 | Nitayama et al. | | 7,176,125 B2 | 2/2007 | Liaw |
| 6,709,807 B2 | 3/2004 | Hallock et al. | | 7,182,823 B2 | 2/2007 | Mandigo et al. |
| 6,710,387 B2 | 3/2004 | Nakamura et al. | | 7,183,164 B2 | 2/2007 | Haller |
| 6,710,402 B2 | 3/2004 | Harada | | 7,183,205 B2 | 2/2007 | Hong |
| 6,723,607 B2 | 4/2004 | Nam et al. | | 7,183,597 B2 | 2/2007 | Doyle |
| 6,734,063 B2 | 5/2004 | Willer et al. | | 7,199,419 B2 | 4/2007 | Haller |
| 6,734,107 B2 | 5/2004 | Lai et al. | | 7,205,192 B2 | 4/2007 | Kweon |
| 6,734,482 B1 | 5/2004 | Tran et al. | | 7,205,598 B2 | 4/2007 | Voshell et al. |
| 6,734,484 B2 | 5/2004 | Wu | | 7,208,379 B2 | 4/2007 | Venugopal et al. |
| 6,744,094 B2 | 6/2004 | Forbes | | 7,214,629 B1 | 5/2007 | Luo et al. |
| 6,756,284 B2 | 6/2004 | Sharma | | 7,226,853 B2 | 6/2007 | Bekiaris et al. |
| 6,756,625 B2 | 6/2004 | Brown | | 7,238,580 B2 | 7/2007 | Orlowski et al. |
| 6,764,949 B2 | 7/2004 | Bonser et al. | | 7,253,118 B2 | 8/2007 | Tran et al. |
| 6,768,663 B2 | 7/2004 | Ogata | | 7,262,089 B2 | 8/2007 | Abbott et al. |

| Patent/Publication | Date | Inventor |
|---|---|---|
| 7,268,054 B2 | 9/2007 | Tran et al. |
| 7,271,107 B2 | 9/2007 | Marks et al. |
| 7,285,812 B2 | 10/2007 | Tang et al. |
| 7,355,273 B2 | 4/2008 | Jackson et al. |
| 7,371,627 B1 | 5/2008 | Forbes |
| 7,372,091 B2 | 5/2008 | Leslie |
| 7,384,868 B2 | 6/2008 | Cabral et al. |
| 7,390,746 B2 | 6/2008 | Bai et al. |
| 7,393,789 B2 | 7/2008 | Abatchev et al. |
| 7,396,767 B2 | 7/2008 | Wu et al. |
| 7,396,781 B2 | 7/2008 | Wells |
| 7,413,981 B2 | 8/2008 | Tang et al. |
| 7,425,491 B2 | 9/2008 | Forbes |
| 2001/0005631 A1 | 6/2001 | Kim et al. |
| 2001/0019870 A1 | 9/2001 | Noble |
| 2002/0000608 A1 | 1/2002 | Harada |
| 2002/0005590 A1 | 1/2002 | Keeth |
| 2002/0024081 A1 | 2/2002 | Gratz |
| 2002/0028541 A1 | 3/2002 | Lee et al. |
| 2002/0030214 A1 | 3/2002 | Horiguchi |
| 2002/0038886 A1 | 4/2002 | Mo |
| 2002/0042198 A1 | 4/2002 | Bjarnason et al. |
| 2002/0043690 A1 | 4/2002 | Doyle et al. |
| 2002/0045308 A1 | 4/2002 | Juengling |
| 2002/0061639 A1* | 5/2002 | Itonaga ............... 438/592 |
| 2002/0063110 A1 | 5/2002 | Cantell et al. |
| 2002/0106772 A1 | 8/2002 | Croteau et al. |
| 2002/0121673 A1 | 9/2002 | Jono et al. |
| 2002/0123216 A1 | 9/2002 | Yokoyama et al. |
| 2002/0125536 A1 | 9/2002 | Iwasa et al. |
| 2002/0127810 A1 | 9/2002 | Nakamura et al. |
| 2002/0130348 A1 | 9/2002 | Tran |
| 2002/0130686 A1 | 9/2002 | Forbes |
| 2002/0135029 A1 | 9/2002 | Ping et al. |
| 2002/0158273 A1 | 10/2002 | Satoh et al. |
| 2002/0182847 A1 | 12/2002 | Yokoyama et al. |
| 2002/0187356 A1 | 12/2002 | Linthicum et al. |
| 2003/0001290 A1 | 1/2003 | Nitayama et al. |
| 2003/0006410 A1 | 1/2003 | Doyle |
| 2003/0008461 A1 | 1/2003 | Forbes et al. |
| 2003/0015757 A1 | 1/2003 | Ohsawa |
| 2003/0040186 A1 | 2/2003 | Juengling et al. |
| 2003/0042542 A1 | 3/2003 | Maegawa et al. |
| 2003/0044722 A1 | 3/2003 | Hsu et al. |
| 2003/0077855 A1 | 4/2003 | Abbott |
| 2003/0085422 A1 | 5/2003 | Amali et al. |
| 2003/0119307 A1 | 6/2003 | Bekiaris et al. |
| 2003/0127426 A1 | 7/2003 | Chang et al. |
| 2003/0132480 A1 | 7/2003 | Chau et al. |
| 2003/0157436 A1 | 8/2003 | Manager et al. |
| 2003/0207207 A1 | 11/2003 | Li |
| 2003/0207584 A1 | 11/2003 | Sivakumar et al. |
| 2003/0218199 A1 | 11/2003 | Forbes et al. |
| 2003/0227072 A1 | 12/2003 | Forbes et al. |
| 2003/0230234 A1 | 12/2003 | Nam et al. |
| 2003/0234414 A1 | 12/2003 | Brown |
| 2004/0000534 A1 | 1/2004 | Lipinski |
| 2004/0002203 A1 | 1/2004 | Deshpande et al. |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0036095 A1 | 2/2004 | Brown et al. |
| 2004/0041189 A1 | 3/2004 | Voshell et al. |
| 2004/0043563 A1 | 3/2004 | Lin et al. |
| 2004/0053475 A1 | 3/2004 | Sharma |
| 2004/0070007 A1 | 4/2004 | Zhang |
| 2004/0079456 A1 | 4/2004 | Mandigo et al. |
| 2004/0079988 A1 | 4/2004 | Harari |
| 2004/0094786 A1 | 5/2004 | Tran et al. |
| 2004/0105330 A1 | 6/2004 | Juengling |
| 2004/0106257 A1 | 6/2004 | Okamura et al. |
| 2004/0150111 A1 | 8/2004 | Shimazu et al. |
| 2004/0195613 A1 | 10/2004 | Kweon |
| 2004/0197989 A1 | 10/2004 | Sommer et al. |
| 2004/0217391 A1 | 11/2004 | Forbes |
| 2004/0235255 A1 | 11/2004 | Tanaka |
| 2005/0001232 A1* | 1/2005 | Bhattacharyya ............ 257/133 |
| 2005/0037584 A1 | 2/2005 | Abbott |
| 2005/0045965 A1 | 3/2005 | Lin et al. |
| 2005/0046048 A1 | 3/2005 | Yun et al. |
| 2005/0048714 A1* | 3/2005 | Noble ........................ 438/243 |
| 2005/0059242 A1 | 3/2005 | Cabral et al. |
| 2005/0074949 A1 | 4/2005 | Jung et al. |
| 2005/0079721 A1 | 4/2005 | Buerger et al. |
| 2005/0017156 A1 | 5/2005 | Jengling |
| 2005/0145913 A1 | 7/2005 | Katsumata et al. |
| 2005/0148136 A1 | 7/2005 | Brask et al. |
| 2005/0156208 A1 | 7/2005 | Lin et al. |
| 2005/0164454 A1 | 7/2005 | Leslie |
| 2005/0184348 A1 | 8/2005 | Youn et al. |
| 2005/0186705 A1 | 8/2005 | Jackson et al. |
| 2005/0207264 A1 | 9/2005 | Hsieh et al. |
| 2005/0272259 A1 | 12/2005 | Hong |
| 2005/0277249 A1 | 12/2005 | Juengling |
| 2006/0011996 A1 | 1/2006 | Wu et al. |
| 2006/0017088 A1 | 1/2006 | Abbott |
| 2006/0019488 A1 | 1/2006 | Liaw |
| 2006/0028859 A1 | 2/2006 | Forbes |
| 2006/0033678 A1 | 2/2006 | Lubomirsky et al. |
| 2006/0043449 A1 | 3/2006 | Tang et al. |
| 2006/0043450 A1 | 3/2006 | Tang et al. |
| 2006/0043473 A1 | 3/2006 | Eppich |
| 2006/0046200 A1 | 3/2006 | Abatchev et al. |
| 2006/0046201 A1 | 3/2006 | Sandhu et al. |
| 2006/0046407 A1 | 3/2006 | Juengling |
| 2006/0046422 A1 | 3/2006 | Tran et al. |
| 2006/0046484 A1 | 3/2006 | Abatchev et al. |
| 2006/0073613 A1 | 4/2006 | Aggarwal et al. |
| 2006/0076090 A1 | 4/2006 | Mandigo et al. |
| 2006/0083996 A1 | 4/2006 | Kim |
| 2006/0094180 A1 | 5/2006 | Doczy et al. |
| 2006/0099793 A1 | 5/2006 | Yang et al. |
| 2006/0157795 A1 | 7/2006 | Chen et al. |
| 2006/0172540 A1 | 8/2006 | Marks et al. |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0246217 A1 | 11/2006 | Weidman et al. |
| 2006/0250593 A1 | 11/2006 | Nishii |
| 2006/0252264 A1 | 11/2006 | Kimizuka et al. |
| 2006/0258084 A1 | 11/2006 | Tang et al. |
| 2006/0258109 A1 | 11/2006 | Juengling |
| 2006/0261393 A1 | 11/2006 | Tang et al. |
| 2006/0263699 A1 | 11/2006 | Abatchev et al. |
| 2006/0264043 A1 | 11/2006 | Stewart et al. |
| 2006/0267075 A1 | 11/2006 | Sandhu et al. |
| 2006/0273456 A1 | 12/2006 | Sant et al. |
| 2006/0278911 A1 | 12/2006 | Eppich |
| 2006/0281250 A1 | 12/2006 | Schloesser |
| 2006/0281266 A1 | 12/2006 | Wells |
| 2006/0289919 A1 | 12/2006 | Juengling |
| 2007/0018206 A1 | 1/2007 | Forbes |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0066019 A1 | 3/2007 | Forbes |
| 2007/0114576 A1 | 5/2007 | Forbes |
| 2007/0138528 A1 | 6/2007 | Haller |
| 2007/0145450 A1 | 6/2007 | Wang et al. |
| 2007/0164319 A1 | 7/2007 | Thomas |

2007/0215960 A1    9/2007    Zhu et al.

FOREIGN PATENT DOCUMENTS

| DE | 42 36 609 A1 | 5/1994 |
|---|---|---|
| DE | 44 08 764 A1 | 9/1994 |
| DE | 199 28 781 C1 | 7/2000 |
| EP | 0 227 303 | 7/1987 |
| EP | 0 491 408 | 6/1992 |
| EP | 0 681 338 | 11/1995 |
| EP | 0 936 623 | 8/1999 |
| EP | 1 061 592 | 12/2000 |
| EP | 1 202 335 A | 5/2002 |
| EP | 1 357 433 | 10/2003 |
| JP | 53-148389 | 12/1978 |
| JP | 60-167349 | 8/1985 |
| JP | 1-100948 | 4/1989 |
| JP | 2-219253 | 8/1990 |
| JP | 4-130630 | 5/1992 |
| JP | 4-162528 | 6/1992 |
| JP | 05343370 | 12/1993 |
| JP | H8-55908 | 2/1996 |
| JP | H8-55920 | 2/1996 |
| JP | 11 040777 | 2/1999 |
| WO | WO 01/01489 A1 | 1/2001 |
| WO | WO 02/099864 A1 | 12/2002 |
| WO | WO 04/001799 A2 | 12/2003 |
| WO | WO 2004/003977 | 1/2004 |
| WO | WO 2004/032246 A | 4/2004 |
| WO | WO 2004/038807 A | 5/2004 |
| WO | WO 2004/073044 | 8/2004 |
| WO | WO 2005/010973 | 2/2005 |
| WO | WO 2005/034215 A1 | 4/2005 |
| WO | WO 2005/119741 A3 | 12/2005 |
| WO | WO 2006/026699 | 3/2006 |

OTHER PUBLICATIONS

"Notes from IEDM, part 3," http://www.thinfilmmfg.com/Noteworthy/Noteworthy01/IEDM12Dec01.htm, 2 pages (Dec. 12, 2001).

"Quantum confinement effects in a 3D FinFET transistor," http://www.ise.com/appex/FinFET/FinFET.html, 5 pages (Jan. 15, 2003).

Ahn, S. J. et al., "Examination and improvement of reading disturb characteristics of a surrounded gate STTM memory cell," In: *2003 Third IEEE Conference on Nanotechnology*, IEEE-NANO 2003, Proceedings (Cat. No. 03TH8700). Piscataway, NJ, USA: IEEE, 2003, pp. 528-530, vol. 2.

Ahn, S. J. et al., "Highly scalable and CMOS-compatible STTM cell technology," In: *IEEE International Electron Devices Meeting 2003*, Piscataway, NJ, USA: IEEE, 2003, pp. 10.4.1-4.

Bergeron, et al., "Resolution Enhancement Techniques for the 90nm Technology Node and Beyond," *Future Fab International*, Issue 15, Jul. 11, 2003, 4 pages.

Bhave et al., "Developer-soluble Gap fill materials for patterning metal trenches in Via-first Dual Damascene process," preprint of *Proceedings of SPIE*: Advances in Resist Technology and Processing XXI, vol. 5376, John L. Sturtevant, editor, 2004, 8 pages.

Cho, H. et al., "A novel pillar DRAM cell 4 Gbit and beyond," *Digest of Technical Papers Symposium on VLSI Technology*, Jun. 9-11, 1998, pp. 38-39.

Cho, H. et al., "High performance fully and partially depleted poly-Si surrounding gate transistors," In: 1999 *Symposium on VLSI Technology*, Digest of Technical Papers (IEEE Cat. No. 99CH 36325). Tokyo, Japan: Japan Soc. Appl. Phys, 1999, pp. 31-32.

Chung et al., "Nanoscale Multi-Line Patterning Using Sidewall Structure," *Jpn., J. App.. Phys.* vol. 41 (2002) Pt. 1, No. 6B, pp. 4410-4414.

Chung et al., "Pattern multiplication method and the uniformity of nanoscale multiple lines," *J. Vac.Sci.Technol.* B21(4), Jul./Aug. 2003, pp. 1491-1495.

Clarke, P., "ISSCC: Vertical transistor structures considered," *EE Times Website*, http://www.eetimes.com, 3 pages (Feb. 9, 2000).

Date, C. K. et al., "Suppression of the floating-body effect using SiGe layers in vertical surrounding-gate MOSFETs," *IEEE Transactions on Electron Devices*, vol. 48, No. 12, Dec. 2001, pp. 2684-2689.

De, I. et al., "Impact of gate workfunction on device performance at the 50 nm technology node," *Solid-State Electronics*, vol. 44, No. 6, Jun. 2000, pp. 1077-1080.

Denton, J. P. et al., "Fully depleted dual-gate thin-film SOI p-MOSFET's fabricated in SOI islands with an isolated buried polysilicon backgate," *IEEE Electron Device Lett.*, vol. 17, No. 11, pp. 509-511, Nov. 1996.

Doyle, B.S. et al., "High performance fully-depleted tri-gate CMOS transistors," *IEEE Electron Device Letters*, vol. 24, No. 4, Apr. 2003, pp. 263-265.

Doyle, B.S. et al., "Tri-Gate fully-depleted CMOS transistors: fabrication, design and layout," 2003 *Symposium on VLSI Technology*. Digest of Technical Papers, Tokyo; Japan Soc. Applied Phys, 2003, pp. 133-134.

Endoh et al., "Novel ultrahigh-density flash memory with a stacked-surrounding gate transistor (S-SGT) structured cell," *IEEE Transactions on Electron Devices*, Apr. 2003, pp. 945-951, vol. 50, No. 4.

Endoh, T. et al, "An accurate model of fully-depleted surrounding gate transistor (FD-SGT)," *IEICE Transactions on Electronics*, vol. E80-C, No. 7, Jul. 1997, pp. 905-910.

Endoh, T. et al., "2.4F2 memory cell technology with stacked-surrounding gate transistor (S-SGT) DRAM," *Electron Devices*, IEEE Transactions on vol. 48, Issue 8, Aug. 2001, pp. 1599-1603.

Endoh, T. et al., An analytic steady-state current-voltage characteristic of short channel fully-depleted surrounding gate transistor (FD-SGT), *IEICE Transactions on Electronics*, vol. E80-C, No. 7, Jul. 1997, pp. 911-917.

Endoh, T. et al., "Analysis of high speed operation for multi-SGT," *Transactions of the Institute of Electronics, Information and Communication Engineers* C-I, vol. J80C-I, No. 8, Aug. 1997, pp. 382-383.

Endoh, T. et al., "The Analysis Of The Stacked-Surrounding Gate Transistor (S-Sgt) DRAM For The High Speed And Low Voltage Operation," *IEICE Transactions on Electronics*, vol. E81-C, No. 9, Sep. 1998, pp. 1491-1498.

Endoh, T. et al., "The Stacked-SGT DRAM using 3D-building memory array technology," *Transactions of the Institute of Electronics, Information and Communication Engineers* C-I, vol. J81C-I, No. 5, May 1998, pp. 288-289.

Endoh, T., et al., "A high signal swing pass-transistor logic using surrounding gate transistor," In: *2000 International Conference on Simulation Semiconductor Processes and Devices* (Cat. No. 00TH8502). Piscataway, NJ, USA: IEEE, 2000. pp. 273-275.

Endoh, T., et al., "Floating channel type SGT flash memory," *Transactions of the Institute of Electronics, Information and Communication Engineers* C-I, vol. J82C-I, No. 3, Mar. 1999, pp. 134-135.

Endoh, T., et al., "The 1.44F2 memory cell technology with the stacked-surrounding gate transistor (S-SGT) DRAM," *Microelectronics, 2000, Proceedings, 2000 22$^{nd}$ International Conference* on, vol. 2, May 14-17, 2000, pp. 451-454, vol. 2.

Forbes, L., "Dram array with surrounding gate access transistors and capacitors over global bit lines", Sep. 2004, 72 pages.

Gili, E. "Fabrication Of Vertical Mos Transistors At Southampton University", *Progress Report, University of Southampton, Facility of Engineering and Applied Sciences, Department of Electronics and Computer Science Microelectronics Group*, Jul. 2003.

Goebel, B., et al., "Fully depleted surrounding gate transistor (SGT) for 70nm DRAM and beyond," Electron Devices Meeting, 2002. *IEDM '02 Digest*. International, Dec. 8-11, 2002, pp. 275-278.

Hioki, M., et al., "An analysis of program and erase operation for FC-SGT flash memory cells," In: *2000 International Conference on Simulation Semiconductor Processes and Devices* (Cat. No. 00TH8502). Piscataway, NJ, USA: IEEE, 2000, pp. 116-118.

Huang, X. et al., "Sub-50 nm P-Channel FinFET," *IEEE Transactions on Electron Devices*, vol. 48, No. 5, May 2001.

Iwai, M., et al., "Buried gate type SGT flash memory," *Transactions of the Institute of Electronics, Information and Communication Engineers* C, vol. J86-C, No. 5, May 2003, pp. 562-564. Journal Paper.

Joubert et al., "Nanometer scale line width control during etching of polysilicon gates in high-density plasmas," *Microelectronic Engineering 69* (2003), pp. 350-357.

Kalavade, P. et al., "A novel sub-10nm transistor," *IEEE Device Research Conf.*, Denver, CO pp. 71-72, Jun. 2000.

Kedzierski, J. et al., "High-Performance Symmetric-Gate And CMOS-Compatible $V_t$ Asymmetric-Gate FinFET Devices," *IEDM*, 2001, paper 19.5., 4 pgs.

Kim, K., et al., "Nanoscale CMOS Circuit Leakage Power Reduction by Double-Gate Device" *International Symposium on Low Power Electronics and Design* Newport Beach Marriott Hotel, Newport, California, Aug. 9-11, 2004, http://www.islped.org.

Kranti, A. et al, "An Analytical Temperature Dependent Threshold Voltage Model For Thin Film Surrounded Gate SOI MOSFET," *Proceedings of the SPIE—The International Society for Optical Engineering*, vol. 3975, pt. 1-2, 2000, pp. 605-608.

Kranti, A. et al., "Optimisation for improved short-channel performance of surrounding/cylindrical gate MOSFETs," *Electronics Letter*, vol. 37, Issue 8, Apr. 12, 2001, pp. 533-534.

Lau et al. "High aspect ratio sub-micron silicon pillars for light emission studies and photonic band gap material application," 1995/6 *Research Journal, Microelectronics Group*, 3 pages (Jun. 1996).

Lau et al., "High aspect ratio submicron silicon pillars fabricated by photoassisted electrochemical etching and oxidation," *Applied Physics Letters*, vol. 67(13), pp. 1877-1879 (Sep. 25, 1995).

Lutze et al., "Field oxide thinning in poly buffer LOCOS isolation with jActive area spacings to 0.1 um," *Journal of Electrochemical Society*, vol. 137, No. 6,pp. 1867-1870 (Jun. 1990).

Mandelman et al., "Challenges and future directions for the scaling of dynamic random-access memory (DRAM)," *IBM. J. Res. & Dev.*, vol. 46, No. 2/3, pp. 187-212 (Mar./May 2002).

Matsouka, F. et al., "A study of soft error in SGT DRAM," *Record of Electrical and Communication Engineering* Conversazione Tohoku University, vol. 71, No. 1, Oct. 2002, pp. 469-470, Journal Paper.

Matsuoka, F. et al., "Numerical analysis of alpha-particle-induced soft errors in floating channel type surrounding gate transistor (FC-SGT) DRAM cell," *Electron Devices*, IEEE Transactions on, vol. 50, Issue 7, Jul. 2003, pp. 1638-1644.

Miyamoto, S. et al., "Effect of LDD structure and channel poly-Si thinning on a gate-all-around TFT (GAT) for SRAM's," *IEEE Transactions on Electron Devices*, vol. 46, No. 8, Aug. 1999, pp. 1693-1698.

Miyano, S., et al., "Numerical analysis of a cylindrical thin-pillar transistor (CYNTHIA)," *IEEE Transactions on Electron Devices*, vol. 39, No. 8, Aug. 1992, pp. 1876-1881.

Nakamura, T., "A study of steady-state characteristics of SGT type three-dimensional MOS transistor," *Record of Electrical and Communication Engineering Conversazione Tohoku University*, vol. 66, No. 1, Jan. 1998, pp. 211-212.

Nishi, R. et al., "Analysis Of The Shape Of Diffusion Layer Of Sgt For Suppressing Substrate Bias Effect," *Transactions of the Institute of Electronics, Information and Communication Engineers C*, vol. J84-C, No. 10, Oct. 2001, pp. 1018-1020.

Nishi, R., et al., "Concave Source SGT for suppressing punch-through effect," *Transactions of the Institute of Electronics, Information and Communication Engineers C*, vol. J86-C, No. 2, Feb. 2003, pp. 200-201.

Nitayama, A., "Multi-pillar surrounding gate transistor (M-SGT) for compact and high-speed circuits," Electron Devices, *IEEE Transactions on*, vol. 38, Issue 3, Mar. 1991, pp. 579-583.

Nitayama, A., et al., "High speed and compact CMOS circuits with multi-pillar surrounding gate transistors," *IEEE Transactions on Electron Devices*, vol. 36, No. 11, pt. 1, Nov. 1989, pp. 2605-2606.

Oehrlein et al., "Pattern transfer into low dielectric materials by high-density plasma etching," *Solid State Tech.*, May 2000, 8 pages.

Peters, L., "Choices and Challenges for Shallow Trench Isolation", Apr. 1, 1999, *Semiconductor International*, www.reed-electronics.com/semiconductor.

Peters, L., "Emerging Transistor Structures", Mar. 1, 2002, *Semiconductor International*, www.reed-electronics.com/semiconductor.

Pohm et al., "Experimental and analytical properties of 0.2 micron wide, multi-layer, GMR, memory elements," *Transactions on Magnetics*, Sep. 1996, pp. 4645-4647, vol. 32, No. 5.

Sakai, T., et al., "A study of stacked-SGT-based pass-transistor logic circuit," *Record of Electrical and Communication Engineering*, Conversazione Tohoku University, vol. 72, No. 2, Feb. 2004, pp. 108-109.

Sakao, M., et al., A Straight-Line-Trench Isolation and Trench-Gate Transistor (SLIT) Cell for Giga-bit DRAMs; *IEEE VLSI Technology Symposium* May 17-19, 1993 Kyoto, Japan, pp. 19-20.

Sakamoto, W. et al., "A study of current drivability of SGT," *Record of Electrical and Communication Engineering* Conversazione Tohoku University, vol. 72, No. 2, Feb. 2004, pp. 110-111.

Seeger et al., "Fabrication of ordered arrays of silicon nanopillars," *J. Phys. D: Appl. Phys.*, vol. 32, pp. L129-L132 (1999).

Sunouchi, K., et al., "A surrounding gate transistor (SGT) cell for 64/256 Mbit DRAMs," Electron Devices Meeting, 1989. *Technical Digest.*, International, Dec. 3-6, 1989, pp. 23-26.

Suzuki, M. et al., "The 2.4F/sup 2/memory cell technology with Stacked-Surrounding Gate Transistor (S-SGT) DRAM," *Transactions of the Institute of Electronics*, Information and Communication Engineers C, vol. J83-C, No. 1, Jan. 2000, pp. 92-93.

Takato, H. et al., "Impact of surrounding gate transistor (SGT) for ultra-high density LSI's," Electron Devices, *IEEE Transactions on*, vol. 38, Issue 3, Mar. 1991, pp. 573-578.

Takato, H., et al., "High performance CMOS surrounding gate transistor (SGT) for ultra high density LSIs," *IEEE Electron Devices Meeting*, Technical Digest, pp. 222-225, 1988.

Terauchi, M. et al., "Depletion isolation effect of surrounding gate transistors," *IEEE Transactions* on, vol. 44, Issue 12, Dec. 1997, pp. 2303-2305.

Terauchi, M., et al., "A Surrounding Gate Transistor (SGT) Gain Cell For Ultra High Density Drams," ULSI Technology, 1993. *Digest of Technical Papers*. 1993 Symposium on, May 17-19, 1993 pp. 21-22.

Watanabe, S. et al., "A novel circuit technology with surrounding gate transistors (SGT's) for ultra high density DRAM's," *Solid-State Circuit, Journal of IEEE*, vol. 30, Issue 9, Sep. 1995, pp. 960-971.

Watanabe, S., "Impact of three-dimensional transistor on the pattern area reduction for ULSI," *IEEE Transaction on Electron Devices*, vol. 50, No. 10, Oct. 2003, pp. 2073-2080.

Wolf et al., "Silicon processing for the VLSI era," vol. 1, Lattice Press, CA, USA, pp. 529-555 (1986).

Wong, H. et al., "Self-aligned (top and Bottom) Double-Gate MOSFET with a 25nm Thick Silicon Channel," *IEEE Int. Electron Device Meeting*, 1997, pp. 427-430.

Xuan, P. et al., "60nm planarized ultra-thin body solid phase epitaxy MOSFETs," *IEEE Device Research Conf.*, Denver, CO, pp. 67-68, Jun. 2000.

Yamashita, H. et al., "A study of process design in three dimensional SGT device," *Record of Electrical and Communication Engineering Conversazione Tohoku University*, vol. 71, No. 1, Oct. 2002, pp. 467-468.

Yan, R. et al., *Scaling the Si MOSFET: From Bulk to SOI to Bulk*; IEEE Transactions on Electron Devices, vol. 39 No. 7 Jul. 1992.

Zhang, W. et al., "A study of load capacitance in SGT," *Record of Electrical and Communication Engineering* Conversazione Tohoku University, vol. 71, No. 1, Oct. 2002, pp. 473-474.

Barth, Roger, "Itrs commodity memory roadmap" Memory Technology, Design and Testing, 2003. Records of the 2003 International Workshop on Jul. 28-29, 2003, Piscataway, NJ, USA, IEEE, Jul. 28, 2003, pp. 61-63.

Bergeron, D., "Resolution Enhancement Techniques for the 90nm Technology Node and Beyond," Future Fab International, Issue 15, Jul. 11, 2003, 4 pages.

Bhave, Mandar, et al., "Developer-Soluble Gap Fill Materials For Patterning Metal Trenches In Via-First Dual Damascene Process," preprint of Proceedings of SPIE: Advances in Resist Technology and Processing XXI, vol. 5376, 2004, 8 pages.

Chen I. C. et al. , "A Trench Isolation Study for Deep Submicron CMOS Technology" VLSI Technology, Systems, and Applications, 1993. Proceedings of Technical Papers. 1993 International Symposium on Taipei, Taiwan May 12-14, 1993, New York, NY, USA, IEEE, US, May 12, 1993, pp. 251-255, XP010068040 ISBN: 0-7803-0978-2.

Cho et al., "A Novel Pillar DRAM cell for 4Gbit and beyond," *IEEE*, 1998, pp. 38-39.

Choi et al., "Sublithographic nanofabrication technology for nanocatalysts and DNA chips," J. Vac. Sci. Techno.l, Nov./Dec. 2003; pp. 2951-2955.

Choi Y-K et al, "Nanoscale CMOS Spacer FinFET for the Terabit Era" IEEE Electron Device Letters, IEEE Inc. New York, US.

Chung, K., "Nanoscale Multi-Line Patterning Using Sidewall Structure," Jpn., J. App.. Phys. vol. 41 (2002) Pt. 1, No. 6B, pp. 4410-4414.

Chung, K., "Pattern Multiplication Method And The Uniformity Of Nanoscale Multiple Lines" J.Vac.Sci.Technol. B21(4), Jul./Aug. 2003, pp. 1491-1495.

Cristoloveanu S: "Introduction to Silicon On Insulator Materials and Devices" Microelectronic Engineering, Elsevier Publishers BV., Amsterdam, NL, vol. 39, No. 1-4, Dec. 1, 1997, pp. 145-154, XP004099506 ISSN: 0167-9317 p. 147, paragraph 3, p. 149, paragraph 3.

Doyle, B. et al., "Tri-Gate Fully-Depleted CMOS Transistors: Fabrication, Design And Layout," 2003 Symposium on VLSI Technology, Digest of Technical Papers, Tokyo; Japan Soc. Applied Phys, 2003.

Endoh, Tetsuo et al., "Novel Ultra High Density Flash Memory With A Stacked-Surrounding Gate Transistor (S-SGT) Structured Cell," International Electron Devices Meeting, Technical Digest, IEEE, 2001, pp. 33-36 (pp. 2.3.1-4).

Goebel et al., "Fully Depleted Surrounding Gate Transistor (SGT) for 70 nm DRAM and Beyond," *IEEE*, 2002, 4 pages.

Hisamoto D. et al., "FinFET-A Self-Aligned Double-Gate Mosfet Scaleable to 20 NM" IEEE Transactions on Electron Devices, IEEE Inc. New York, US, vol. 47, No. 12, Dec. 2000 pp. 2320-2325, XP000977037 ISSN: 0018-9383 p. 2324, paragraph 3.

Imai K et al: "Crystalline Quality of Silicon Layer Formed by Fipos Technology" Journal of Crystal Growth, North-Holland Publishing Co. Amsterdam, NL, vol. 63, 1983, pp. 547-553, XP000602040 ISSN: 0022-0248.

Joubert, O. "Nanometer Scale Linewidth Control During Etching Of Polysilicon Gates In High-Density Plasmas," Microelectronic Engineering 69 (2003), pp. 350-357.

Kal S., "Isolation Technology in Monolithic Integrated Circuits: an overview" IETE Technical Review India, vol. 11, No. 2-3, Mar. 1994, pp. 91-103, XP001247916 ISSN: 0256-4602.

Nitayama, Akihiro, et al. "Multi-Pillar Surrounding Gate Transistor (M-SGT) For Compact And High-Speed Circuits," IEEE Transactions on Electron Devices, vol. 38, Issue 3, Mar. 1991, pp. 579-583.

Oehrlein, G., "Pattern Transfer Into Low Dielectric Materials By High-Density Plasma Etching," Solid State Tech., May 2000, 8 pages.

Pohm, et al., "Experimental and Analytical Properties of 0.2-um-Wide, End-On, Multilayer Giant Magnetoresistance, Read Head Sensors," Journal of Applied Physics, vol. 79, Issue 8, Apr. 1996, pp. 5889-5891.

Sakao et al., "A Straight-Line-Trench Isolation and Trench-Gate Transistor (SLIT) Cell for Giga-bit DRAMs", 3A-2, pp. 19-20, ULSI Device Development Laboratories, NEC Corporation, Sagamihara, Kanagawa 229 Japan.

Schloesser et al., "Highly Scalable Sub-50nm Vertical Gate Trenh Dram Cell", Memory Development Center, Infineon Tech., 2004, 4 pages.

Sunouchi et al., "A Surrounding Gate Transistor (SGT) cell for 64/256 Mbit DRAMs," *IEEE*, ULSI Research Center, Toshiba Corporation, Japan, 1989, pp. 2.1.1-2.1.4.

Takato et al., "High Performance CMOS Surrounding Gate Transistor (SGT) For Ultra High Density LSIs," *IEEE*, 1988, 4 pages.

Takeda, Eiji et al. "A New Soi Device-Delta-Structure and Characteristics" IEICE Transactions, Institute of Electronics Information and Comm. Eng. Tokyo, JP, vol. E74, No. 2, Feb. 1, 1991, pp. 360-368, XP000230407 ISSN: 0917-1673, p. 361, paragraph 7-8.

Wong et al., "Self-Aligned (Top and Bottom) Double-Gate MOSFET with a 25 nm Thick Silicon Channel," IBM T.J. Watson Research Center, 4 pages.

U.S. Appl. No. 11/457,423, filed Jul. 13, 2006, Leonard Forbes.

U.S. Appl. No. 11/462,617, filed Aug. 4, 2006, Leonard Forbes, Jun. 5, 2008 Non-Final Office Action.

Lim, et al., "Atomic Layer Deposition of Transition Metals", Nature vol. 2, Nov. 2003, pp. 749-753.

U.S. Appl. No. 11/457,423, filed Jul. 13, 2006, Leonard Forbes, Dec. 18, 2008 Notice of Allowance, May 20, 2008 Office Action.

U.S. Appl. No. 11/462,617, filed Aug. 4, 2006, Leonard Forbes, Nov. 20, 2008 Notice of Allowance, Jun. 5, 2008 Non-Final Office Action.

* cited by examiner

DRAM INCLUDING A VERTICAL SURROUND GATE TRANSISTOR

RELATED APPLICATION

This application is a continuation of U.S. application Ser. No. 11/188,507, filed Jul. 25, 2005, which is hereby incorporated by reference in its entirety herein.

BACKGROUND OF THE INVENTION

1. Field of the Invention

This invention relates to microelectronic devices and related fabrication methods. More particularly, the invention relates to microelectronic vertical field effect transistors and related fabrication methods.

2. Description of the Related Art

Since the introduction of the digital computer, electronic storage devices have been a vital resource for the retention of data. Conventional semiconductor electronic storage devices, such as Dynamic Random Access Memory (DRAM), typically incorporate capacitor and transistor structures in which the capacitors temporarily store data based on the charged state of the capacitor structure. In general, this type of semiconductor Random Access Memory (RAM) often requires densely packed capacitor structures that are easily accessible for electrical interconnection.

A dynamic random access memory cell typically comprises a charge storage capacitor (or cell capacitor) coupled to an access device, such as a Metal-Oxide-Semiconductor Field Effect Transistor (MOSFET, or simply FET). These access devices function to apply or remove charge on the capacitor, thus affecting a logical state defined by the stored charge. The amount of charge stored on the capacitor is determined by the electrode (or storage node) area and the inter-electrode spacing. The conditions of DRAM operation such as operating voltage, leakage rate and refresh rate, will generally mandate that a certain minimum charge be stored by the capacitor.

FETs are widely used in integrated circuit devices including logic, memory and/or microprocessor devices that are used in consumer and/or industrial applications. For example, FETs are commonly used as the access device for DRAM memories. As the integration density of integrated circuit FETs continues to increase, it may be desirable to continue to shrink the dimensions of the FETs. Conventionally, features of integrated circuit FETs may be formed on a microelectronic substrate, such as silicon semiconductor substrate, using photolithography and etching. Unfortunately, as the minimum feature size scales into the sub-0.1 micron region, it may be increasingly difficult to define such small features using traditional lithography and etching. Although improved nano-lithography techniques may be developed, it still may be difficult to reliably define features as small as 35 nm or smaller in a controllable and cost-effective way using lithography, to allow mass production.

In order to increase efficiency of memory devices, there is a similar effort to create smaller memory cells. DRAM memory cells can shrink in several ways. One way to decrease the size of a memory cell is to reduce the minimum feature size (F). This generally occurs through new and advanced lithography and etching techniques. Memory cells can also be decreased by designing a smaller memory cell. For example many of the DRAM chips on the market today have a memory cell size of $8F^2$ or greater, where F is the dimension of the minimum feature for a given manufacturing process. However, as the size of FETs and memory cells continue to decrease, there is an increase in the electrostatic charge sharing between gate and source-drain regions of the transistor devices. This electrostatic charge sharing is typically referred to as the short channel effect. As those of skill in the art readily recognize, as the length of the transistor channel decreases, the threshold voltage of the transistor also increases due to the short channel effect. Thus, there is a need for improved systems and methods of reducing the size of memory devices, while reducing the short channel effect on the reduced size memory devices.

SUMMARY OF THE INVENTION

Processes for forming memory cells including vertical surround gate transistors are disclosed. In an advantageous embodiment, the memory cells have a feature size of less than about $4F^2$. In one embodiment, a $4F^2$ DRAM comprises a vertical surround gate transistor.

In one embodiment, a DRAM memory device comprises a vertical transistor comprising a source, a drain, a surround gate, and a channel region. The DRAM memory device further comprises a bit line electrically coupled to the drain of the vertical transistor, wherein the gate comprises a word line of the memory device, and a capacitor electrically coupled to the source.

In one embodiment, a method of manufacturing a DRAM memory device having a feature size of less than about $4F^2$ comprises forming a vertical surround gate transistor comprising a source, a drain, a surround gate, and a channel region, wherein, the gate comprises a word line of the memory device. The method further comprises forming a bit line so that the bit line is electrically coupled to the drain of the vertical transistor, and forming a capacitor so that the capacitor is electrically coupled to the source.

In another embodiment, a DRAM memory device comprises a vertical transistor comprising a source, a drain, a gate, and a channel region, wherein, at least a portion of the gate is silicided to form a word line contact of the memory device. The DRAM memory device further comprise a bit line electrically coupled to the drain of the vertical transistor, and a capacitor electrically coupled to the source.

In another embodiment, a method of forming a memory device having a vertical surround gate transistor comprising forming a semiconductor substrate comprising a first layer having a first doping and a second layer above the first layer having a doping opposite the first doping, forming a silicided drain contact in electrical contact with the second layer, forming a dielectric layer on a portion of the silicided drain contact, forming a vertically extending polysilicon gate on the dielectric layer, forming a vertically extending silicided gate on the dielectric layer, epitaxially growing a channel region on the second layer so that the polysilicon gate is sandwiched between the channel region and the silicided gate, epitaxially growing a source region on the channel region so that a portion of the source region is in electrical contact with the polysilicon gate, and forming a capacitor in electrical contact with the source region.

DETAILED DESCRIPTION OF THE PREFERRED EMBODIMENT

Figure 1A:
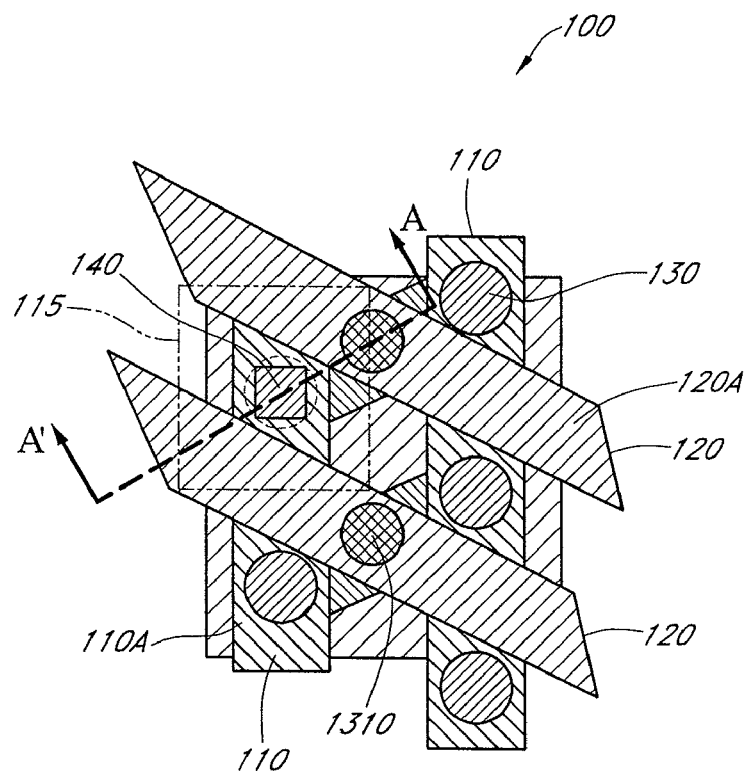
FIG. 1A is a schematic top view of a portion of a memory device.

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

In the context of this document, the term "semiconductor substrate" is defined to mean any construction comprising semiconductor materials, including, but not limited to, bulk semiconductor materials such as a semiconductor wafers, and semiconductor material layers. The term "substrate" refers to any supporting substrate, including, but not limited to, the semiconductor substrates (either alone or in assemblies comprising other materials thereon) described above. Also in the context of this document, the term "layer" encompasses both the singular and the plural unless otherwise indicated.

Double gate and/or surround gate FETs have been proposed to reduce the short channel effect. A double/surround gate FET may include a thin channel that is controlled by both a front gate and a back gate. Short channel effects may be suppressed because the two gates can be effective in terminating drain field lines and preventing the drain potential from impacting the source. Double gate devices may be extended to provide surround gate devices in which the gate wraps around the channel. FETs including double/surround gate FETs may be grouped into two categories based on the channel orientation. In horizontal devices, carrier conduction from source to drain through the channel occurs in a direction that is generally parallel to the face of the microelectronic substrate. In contrast, in vertical devices, carrier conduction from source to drain through the channel occurs in the vertical direction, generally orthogonal to the face of the microelectronic substrate.

Vertical transistor designs can be used to decrease chip real estate occupied by a memory cell transistor. An example of a memory cell with a vertical transistor is disclosed in U.S. Pat. No. 6,756,625, issued to Brown, the disclosure of which is incorporate by reference herein.

The following description describes memory device structures that advantageously have a smaller feature size than is currently known in the art and reduce the short channel effect on the memory device. In an advantageous embodiment, the memory devices have a feature size of about $4F^2$. In other embodiments, memory devices having features sizes of less than $4F^2$ may also be manufactured according to the methods described herein. In addition, embodiments of memory devices having low resistance word lines and/or bit lines, which may allow the memory devices to operate at higher frequencies, are also described. Methods of fabricating these memory devices are also disclosed herein.

Figure 1B:
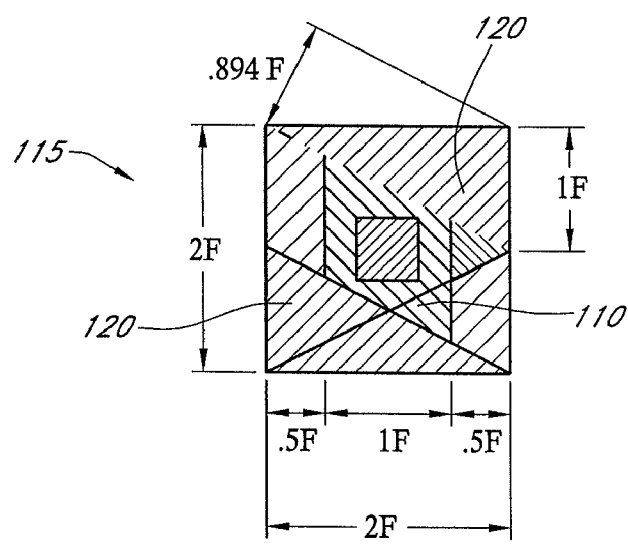
FIG. 1B is a schematic top view of a portion of a memory device.

FIG. 1A is a schematic top view of a portion of a memory device 100. As illustrated in FIG. 1A, the memory device 100 comprises word lines 110 and bit lines 120. In a memory device, such as DRAM, each of the memory cells includes a capacitor 130 and an epitaxially grown pillar 140 that consists of the source, drain, gate and channel region of the memory cell. In one embodiment, the word lines 110 and bit lines 120 are non-orthogonal. For example, FIG. 1B is a top view of a memory cell comprising non-orthogonal word lines 110 and bit lines 120, wherein the memory cell has a feature size of about $4F^2$.

FIGS. 2-14 are each diagrammatic section views of the memory device illustrated in FIG. 1. These figures illustrate an exemplary process of fabricating a memory device that includes a surround gate vertical transistor and advantageously has a feature size of about $4F^2$. In addition, embodiments of the memory device also include low resistance word line and bit line contacts, and combine a vertical transistor with a stack capacitor. The following example is provided as an illustration of one method of forming a memory device according to the general systems and methods described herein. Accordingly, the invention is not limited to the specific embodiments described with respect to FIGS. 2-14. In particular, other embodiments of memory devices having one or more of the features described with reference to the memory device illustrated in FIGS. 2-14 are contemplated.

Figure 2:
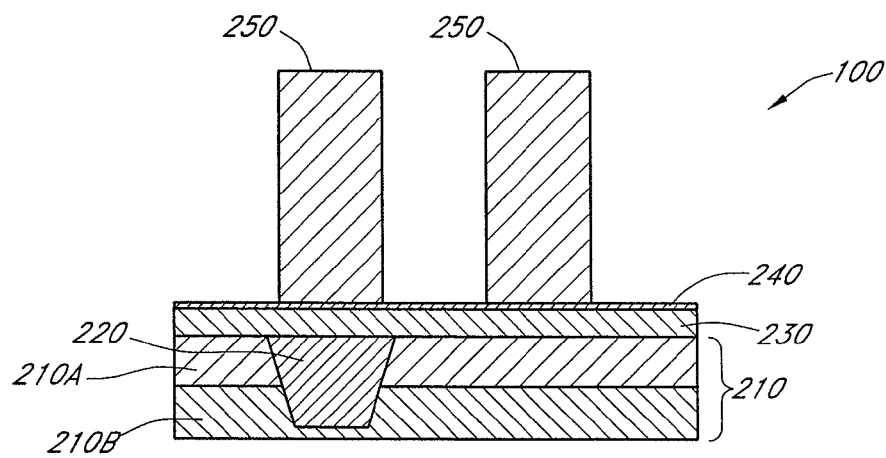
FIG. 2 is a diagrammatic section view of the memory device illustrated in FIG. 1, taken along line A-A'.

FIG. 2 is a diagrammatic section view of the memory device illustrated in FIG. 1. In FIG. 2, the memory device 100 is at an initial stage of fabrication. A shallow trench isolation (STI) 220 area has been etched into a semiconductor wafer 210. In the embodiment of FIG. 2, the semiconductor wafer 210 includes two layers 210A and 210B that are doped with oppositely charged ions. For example, in one embodiment the semiconductor layer 210A is an N-type semiconductor material while the semiconductor layer 210B is a P-type semiconductor material. However, in other embodiments, the doping of the semiconductor wafer 210 may be patterned differently. For example, in one embodiment the semiconductor layer 210A may be P-type and the semiconductor layer 210B may be N-type. In one embodiment, the semiconductor wafer 210A is about 750 Angstroms thick. In one embodiment, the STI 220 is about 2,000 Angstroms deep in the semiconductor wafer 210. In one embodiment, the STI 220 is filled with an oxide, such as may be formed using a High Density Plasma (HDP) Chemical Vapor Deposition (CVD) process.

With the semiconductor wafer 210 patterned with the STI 220, an oxide layer 230 is deposited on the semiconductor wafer 210. In one embodiment, the oxide layer is about 500 Angstroms thick and is deposited using a CVD process. Next, a nitride layer 240 is deposited on the oxide layer 230 using a CVD process, for example. In one embodiment, the nitride layer 240 is about 200 angstroms thick. Finally, a thick oxide layer is deposited on the surface of the nitride layer 240, and is patterned and etched using a Reaction Ion Etch (RIE) process, for example, to form pillars 250. In the embodiment of FIG. 2, the RIE process stops etching at the top surface of the nitride layer 240. In one embodiment, the oxide pillars 250 are about 3000 angstroms thick. In other embodiment, the thickness of these layers may be adjusted in order to achieve varied results.

Figure 3:
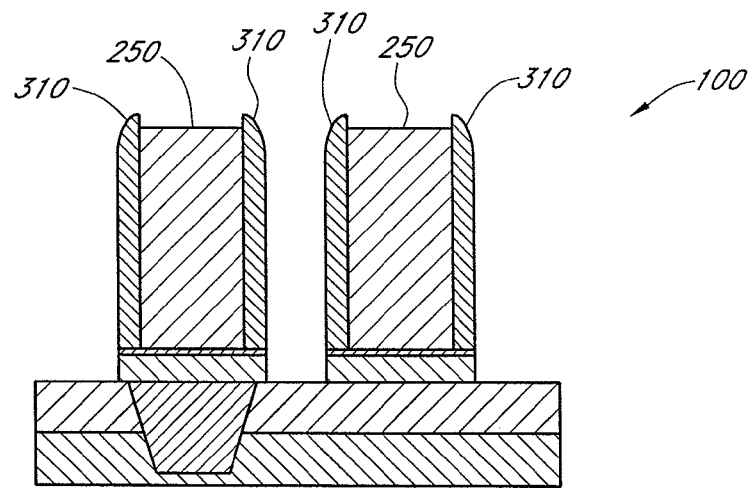
FIG. 3 is a view of FIG. 2 shown at a processing stage subsequent to that of FIG. 2.

Moving to FIG. 3, the memory device 100 is further processed. In particular, dielectric spacers 310 are formed on the lateral edges of the pillars 250 by dielectric deposition and an anisotropic RIE. The nitride layer 240 and the oxide layer 230 are then selectively etched, stopping at the semiconductor layer 210A. In one embodiment, the dielectric spacers 310 comprise nitride materials, such as Silicon Nitride. In one embodiment, the spacers 310 are about 200 Angstroms thick.

Figure 4:
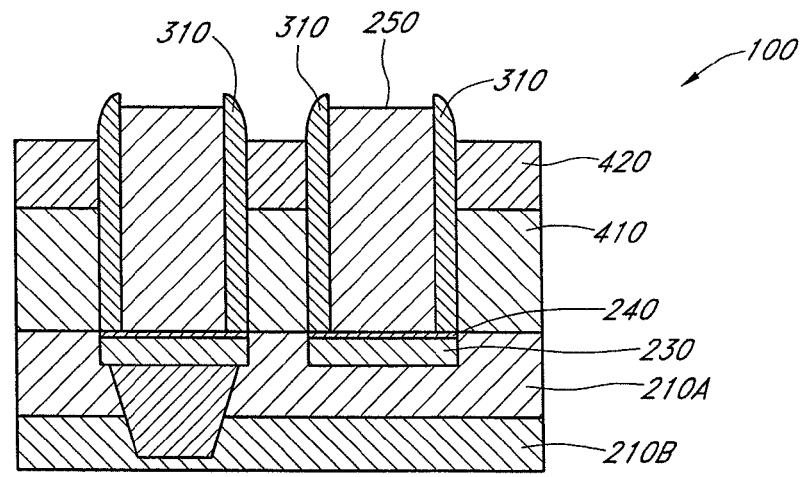
FIG. 4 is a view of FIG. 3 shown at a processing stage subsequent to that of FIG. 3.

Turning to FIG. 4, additional doped layers of semiconductor material are grown between the pillars 250. In one embodiment, layer 210A is epitaxially extended, with the same doping as originally used in layer 210A of FIGS. 1 and 2, so that layer 210A extends along layer 230 and optionally up to or past layer 240. Layers 410 and 420 are also epitaxially grown between the spacers 310 that surround lateral sides of the pillars 250. In the exemplary embodiment of FIG. 4, doped layer 210A is epitaxially thickened and then the semiconductor layer 410 (which is doped with the same type of doping, e.g., N or P type doping, as semiconductor layer 210B) is grown between the spacers 310, followed by growing of the semiconductor layer 420 (which is doped with the same type of doping as semiconductor layer 210A). Thus, the entire stack of semiconductor material now comprises alternatively doped layers 210B, 210A, 410, and 420.

Figure 5:
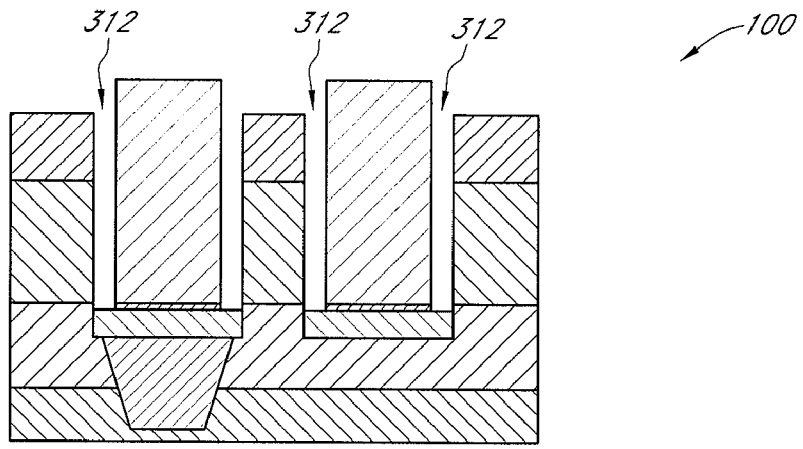
FIG. 5 is a view of FIG. 4 shown at a processing stage subsequent to that of FIG. 4.
Figure 6:
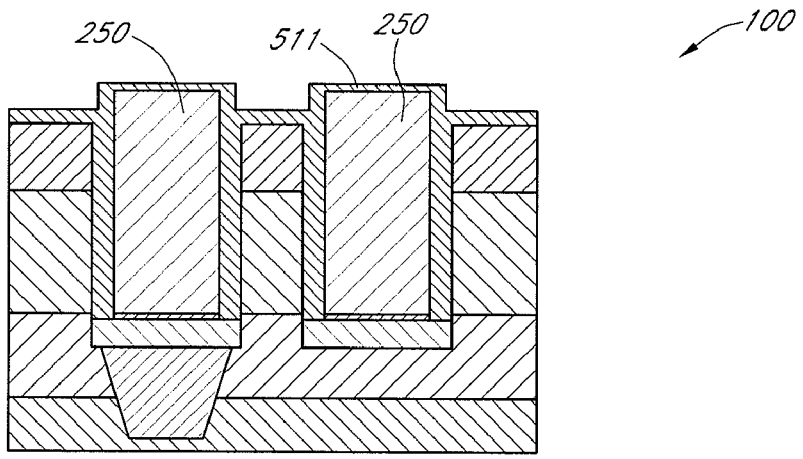
FIG. 6 is a view of FIG. 5 shown at a processing stage subsequent to that of FIG. 5.

Moving to FIG. 5, the dielectric spacer 310 is removed, such as by using a chemical etching process selective to the dielectric material of the oxide layer 230 and the pillars 250, leaving a void 312. In FIG. 6, a thin gate oxide (not shown) is grown on the memory device 100. More particularly, the thin gate oxide is grown on the exposed surfaces of semiconductor layers 210A, 410, 420. Subsequently, a polysilicon layer 511 is deposited on the exposed surfaces of the memory device 100. As illustrated in FIG. 6, the polysilicon layer 511 covers the pillars 250.

Figure 7:
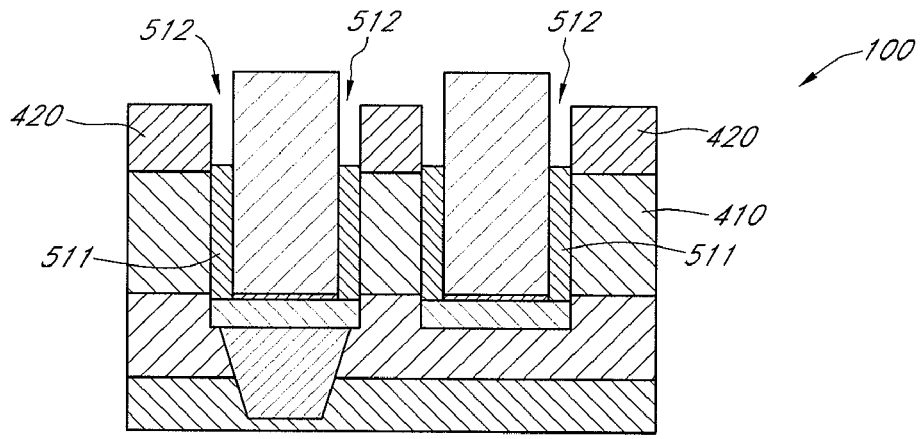
FIG. 7 is a view of FIG. 6 shown at a processing stage subsequent to that of FIG. 6.
Figure 8:
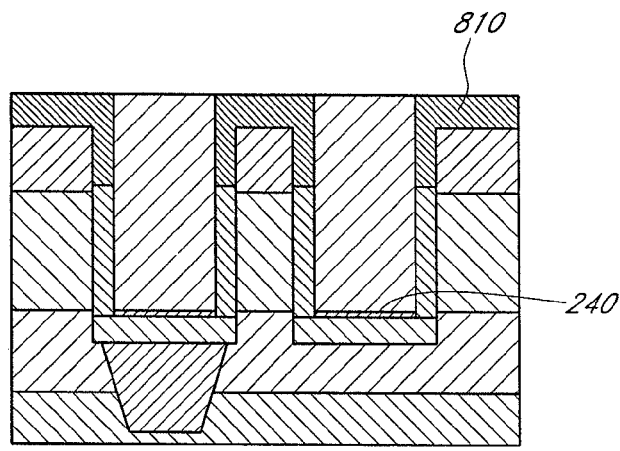
FIG. 8 is a view of FIG. 7 shown at a processing stage subsequent to that of FIG. 7.

In FIG. 7, a portion of the polysilicon 511 is etched back using either an RIE or chemical etching process selective to the thin gate oxide. This etching exposes an upper portion of the pillars 250 and a portion of the semiconductor layer 420, leaving a void 512. In one embodiment, the polysilicon 511 is removed to an elevational level that is above the semiconductor layer 410. In FIG. 8, a dielectric material 810 is deposited in the void 512 (FIG. 7). In one embodiment, the dielectric 810 is a nitride, such as Silicon Nitride, for example. However, the dielectric 810 may comprise any other dielectric, or combinations of dielectrics. In one embodiment, the dielectric 810 is planarized using Chemical Mechanical Polishing (CMP), for example so that an upper surface of the dielectric 810 is aligned with the upper surface of the pillars 250.

Figure 9:
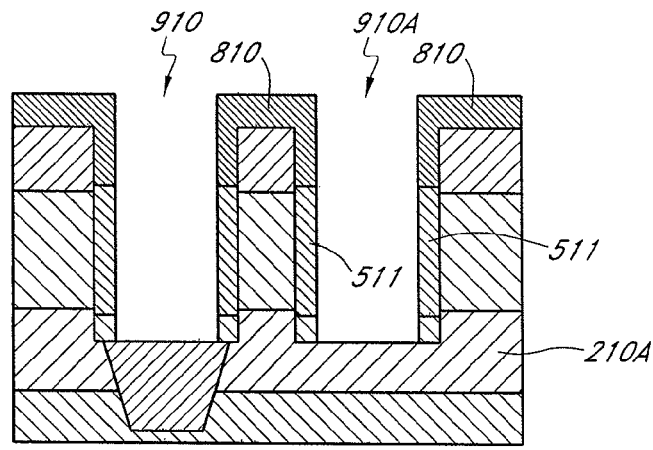
FIG. 9 is a view of FIG. 8 shown at a processing stage subsequent to that of FIG. 8.

In FIG. 9, the pillars 250 (FIGS. 2-8), which may comprise an oxide, are stripped away using a chemical process, for example, thereby forming trenches 910 between the polysilicon 511 and the dielectric 810. In one embodiment, a RIE process is used to remove portions of the nitride layer 240 (e.g., FIG. 8) and oxide 230 (e.g., FIG. 8). As illustrated in FIG. 9, a first trench 910A exposes the semiconductor layer 210A.

Figure 10:
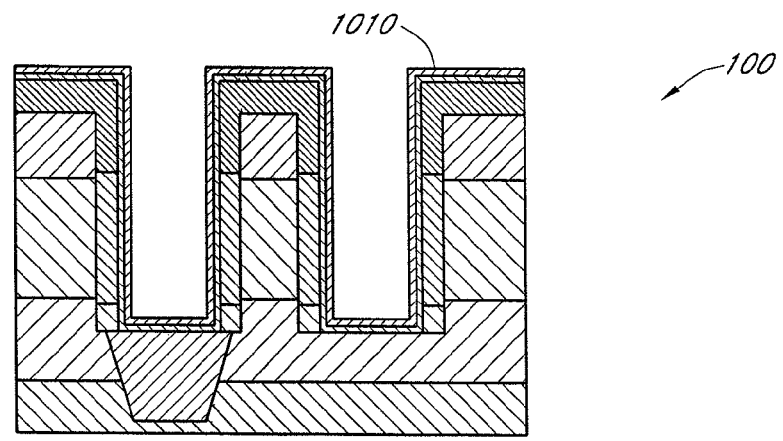
FIG. 10 is a view of FIG. 9 shown at a processing stage subsequent to that of FIG. 9.

In FIG. 10, a thin metal 1010 is deposited on the exposed surfaces of the memory device 100. In one embodiment, the metal comprises cobalt or nickel. In one embodiment, the thin metal 1010 is covered with a Ti or TiN layer. In one embodiment, the exposed thin metal 1010 is exposed to an increased temperature that is sufficiently high to react the Cobalt or Nickel portions with the polysilicon layer 511. This reaction forms a silicided layer 1110 (e.g., FIG. 11). The non-reacting portions of the thin metal 1110, such as above the silicided layer 1110, may then be stripped using a chemical etch, for example. In one embodiment, portions of the metal will be used as bit and word line contacts of the memory device 100.

Figure 11:
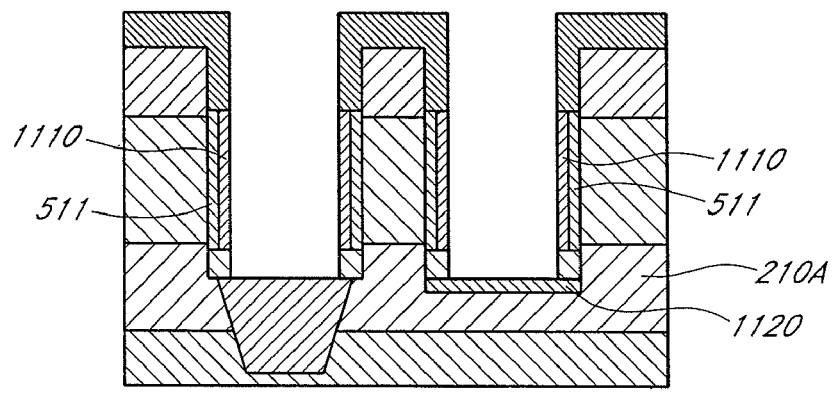
FIG. 11 is a view of FIG. 10 shown at a processing stage subsequent to that of FIG. 10.

Moving to FIG. 11, with a portion of the polysilicon layer 511 silicided, the gate of the vertical transistor becomes a surround gate structure, including a silicided gate 1110 and a poly silicon gate 511. Because a surround gate structure is used in the memory device 100, the short channel effects within the memory device are advantageously reduced. In addition, due to the silicidation of the gate contact 1110, a low resistance word line is formed. Similarly, due to the silicidation of the semiconductor layer 210A, a low resistance drain contact 1120 is formed. As those of skill in the art will appreciate, as the resistance of the bitline and wordline of a memory device are decreased, the operating frequency of the memory device may be correspondingly increased. Accordingly, in one embodiment the silicidation of the word line and bit line provides a lower resistance, faster, memory device.

Figure 12:
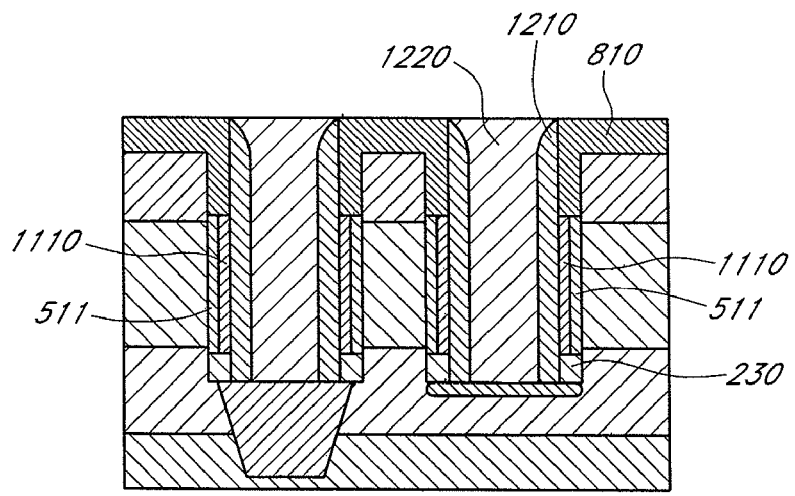
FIG. 12 is a view of FIG. 11 shown at a processing stage subsequent to that of FIG. 11.

In FIG. 12, a nitride spacer 1210 is formed to cover the sidewalls of the trenches 910 (e.g., FIG. 9), including the gate contact 1110. In one embodiment, a nitride film is deposited by CVD and an anisotropic etch is used to form the nitride spacer 1210. Next, a dielectric 1220 is deposited using a CVD process, for example, between the nitride spacers 1210. In one embodiment, the dielectric 1220 is oxide and is planarized using a process such as CMP.

Figure 13:
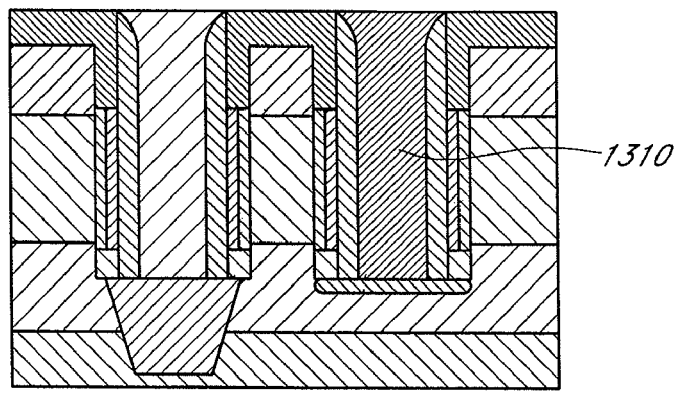
FIG. 13 is a view of FIG. 12 shown at a processing stage subsequent to that of FIG. 12.

In FIG. 13, a bit line to drain contact 1310 is created (see FIG. 1A also). In one embodiment, the path 1310 comprises Tungsten. In one embodiment, the drain contact 1310 is formed by a mask that exposes dielectric 1220, performing a RIE to remove the dielectric 1220 selective to 1210, and depositing the drain contact material, such as Tungsten, followed by a CMP of the Tungsten.

Figure 14:
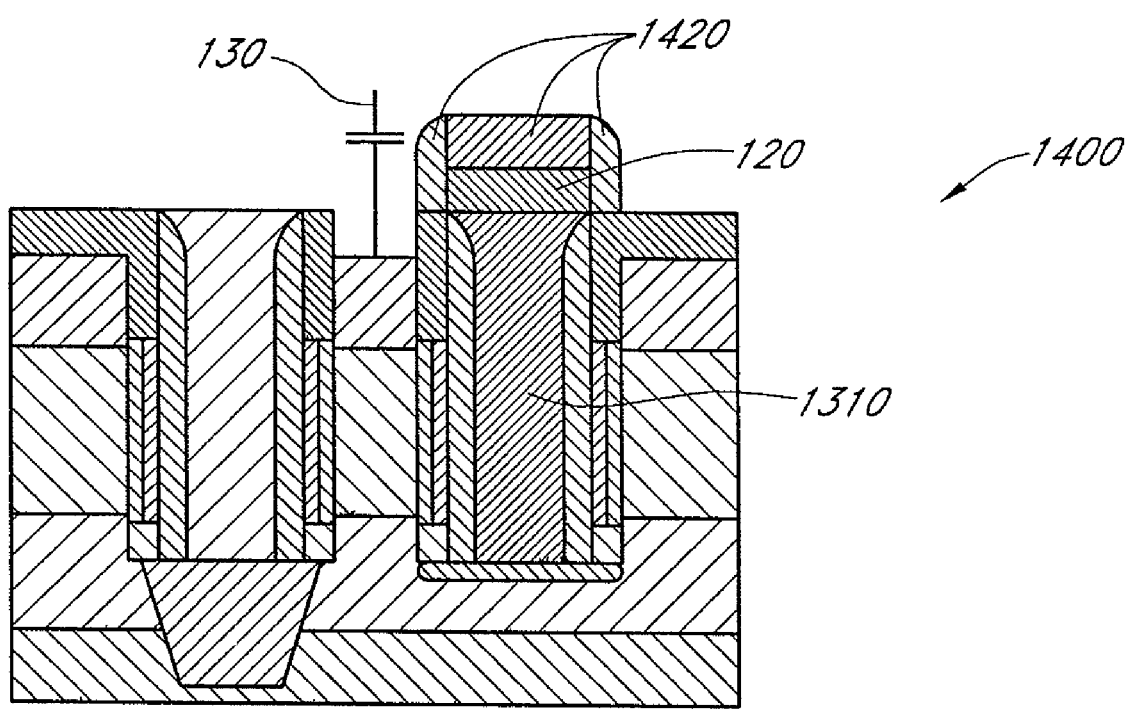
FIG. 14 is a view of FIG. 13 shown at a processing stage subsequent to that of FIG. 13.

In FIG. 14, the bit line 120 is formed on the contact 1310. In one embodiment, the bit line contact 120 comprises W, Al, Cu, or a combination of these metals. In the embodiment of FIG. 14, a dielectric 1420 is formed around the bit line 120. In one embodiment, the dielectric 1420 protects the bit line 120 from processes that may be used in formation of the capacitor 130. In another embodiment, the capacitor 130 may be formed prior to formation of the bit line 120 and the dielectric 1420 may be unnecessary.

Having completed the processing steps depicted in FIGS. 2-14, the resulting DRAM memory cell 1400 advantageously includes a reduced resistance word line, a reduced resistance bit line contact, and a surround gate vertical transistor. In addition, using the processing steps described above, or similar processes known in the art, the feature size of the memory cells may be reduced without increasing the short channel effect. In an advantageous embodiment, the memory cell 115 (FIG. 1) has a feature size of about $4F^2$.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A method of forming a vertical memory cell, the method comprising:
   forming a vertical memory cell comprising:
      a source,
      a drain,
      a polysilicon surround gate to extend in a first generally vertically extending direction, and
      a generally vertically extending channel region, wherein the source is arranged at an upper end of the vertically extending channel region and wherein the drain is arranged at an opposite lower end of the vertically extending channel region;
   depositing a dielectric to cover a horizontal upper surface of the polysilicon surround gate;
   forming a trench extending along the surround gate so as to expose a vertical surface of the surround gate;
   depositing a thin metal on the exposed vertical surface of at least the polysilicon surround gate while the horizontal upper surface of the polysilicon surround gate remains covered by the dielectric;
   exposing the thin metal to heat that is sufficiently high to react at least a portion of the thin metal with at least a portion of the polysilicon gate in order to form a silicided gate extending along a vertical length of the formerly exposed vertical surface of the polysilicon surround gate;
   forming a spacer arranged to cover at least the silicided gate contact; and
   forming a second separate generally vertical conductive path extending from a drain contact upwards to above the surround gate, wherein the drain contact is arranged adjacent the lower end of the vertically extending channel region.

2. The method of claim 1, wherein the thin metal comprises Cobalt.

3. The method of claim 1, wherein the thin metal comprises Nickel.

4. The method of claim 1, wherein the thin metal comprises Titanium.

5. The method of claim 1, wherein the thin metal comprises a layer of either Cobalt or Nickel and a layer of either Titanium or Titanium Nitride.

6. The method of claim 1, further comprising siliciding at least a portion of the drain such that the drain contact is at least partially silicided.

7. The method of claim 1, wherein the polysilicon surround gate comprises a word line contact.

8. The method of claim 1, wherein the memory cell comprises a DRAM cell.

9. The method of claim 1, further comprising forming a capacitor in contact with the source.

10. A vertical memory cell comprising:
    a source region;
    a drain region;
    a polysilicon surround gate extending generally vertically between the source region and drain region;
    a channel region extending generally vertically between the source region and the drain region wherein the source region is arranged at an upper end of the vertically extending channel region and wherein the drain region is arranged at an opposite lower end of the vertically extending channel region;
    a vertically extending silicided surround gate contact arranged adjacent the polysilicon surround gate wherein the polysilicon surround gate and the silicided surround gate contact extend along a vertical length of the channel region;
    an insulating sidewall spacer arranged to cover a vertical outer surface of the silicided gate contact; and
    a separate second conductive path extending generally vertically from a silicided drain contact over the drain region to above the polysilicon surround gates and the spacer and wherein the drain contact is arranged adjacent the lower end of the vertically extending channel region, the second conductive path insulated from the silicided surround gate contact by the insulating sidewall spacer.

11. A method of forming a memory device comprising a plurality of vertical memory cells, the method comprising:
    forming a plurality of vertical memory cells each comprising a polysilicon surround gate vertically extending over a channel region, a source arranged generally at an upper end of the channel region, and a drain arranged generally at an opposite lower end of the channel region;
    depositing dielectric to cover upper surfaces of the polysilicon surround gates;
    forming trenches to expose vertical surfaces of the polysilicon surround gates;
    depositing a thin metal on the exposed vertical surfaces of the polysilicon surround gate of each memory cell;
    exposing the thin metal to heat that is sufficiently high to react at least a portion of the thin metal with at least a portion of the polysilicon gate in order to form a silicided gate contact adjacent and extending across an entire vertical length of the polysilicon surround gate in each of the memory cells;
    forming sidewall spacers arranged to cover at least the silicided gate contacts; and
    forming second separate generally vertical conductive paths extending from respective drain contacts upwards to above the respective surround gate, wherein the drain contacts are arranged adjacent the lower end of the respective vertically extending channel region and wherein the second generally vertical conductive paths are isolated from the silicided gate contacts by the sidewall spacers.

12. The method of claim 11, further comprising siliciding at least a portion of the drains of each of the memory cells such that the drain contacts in each memory cell are at least partially silicided.

13. The method of claim 12, wherein bit lines of the memory device are electrically connected to first subsets of the silicided drain contacts via respective separate second vertical conductive paths.

14. The method of claim 11, wherein a word line of the memory device comprises a second subset of the polysilicon surround gates.

15. The method of claim 11, wherein the thin metal comprises material selected from the group comprising Tungsten, Nickel, and Cobalt.

16. The method of claim 11, further comprising depositing a second thin metal on the thin metal prior to exposing the thin metal to heat.

17. The method of claim 16, wherein the second thin metal comprises material selected from the group comprising Titanium and Titanium Nitride.

18. The method of claim 11, wherein the memory device comprises a DRAM.

19. The method of claim 1, further comprising forming a bit line in contact with the separate second generally vertical conductive path such that the bit line is arranged at an elevation above the surround gate.

20. The method of claim 19, further comprising forming a word line such that the word line and the bit line are non-orthogonal.

21. The method of claim 11, further comprising forming a plurality of word lines and a plurality of bit lines such that the word lines and the bit lines are non-orthogonal.

22. The method of claim 11, further comprising forming bit lines in contact with respective separate second generally vertical conductive paths such that the bit lines are arranged at an elevation above the respective surround gates.

* * * * *

UNITED STATES PATENT AND TRADEMARK OFFICE
CERTIFICATE OF CORRECTION

PATENT NO. : 7,566,620 B2  
APPLICATION NO. : 11/461246  
DATED : July 28, 2009  
INVENTOR(S) : Todd R. Abbott Page 1 of 1

It is certified that error appears in the above-identified patent and that said Letters Patent is hereby corrected as shown below:

In column 8, line 12, in Claim 10, delete "gates" and insert -- gate --, therefor.

Signed and Sealed this

Eighth Day of September, 2009

David J. Kappos  
*Director of the United States Patent and Trademark Office*